(12) United States Patent
Ning

(10) Patent No.: US 6,709,874 B2
(45) Date of Patent: Mar. 23, 2004

(54) METHOD OF MANUFACTURING A METAL CAP LAYER FOR PREVENTING DAMASCENE CONDUCTIVE LINES FROM OXIDATION

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 18 days.

(21) Appl. No.: 09/798,101

(22) Filed: Mar. 2, 2001

(65) Prior Publication Data

US 2002/0096775 A1 Jul. 25, 2002

Related U.S. Application Data

(60) Provisional application No. 60/263,993, filed on Jan. 24, 2001.

(51) Int. Cl.[7] ............................................. H01L 21/00
(52) U.S. Cl. ..................... 438/3; 438/625; 438/626; 438/627; 438/628; 438/629; 438/631; 438/642; 438/643; 438/644; 438/645; 438/648; 438/652; 438/653; 438/654; 438/656; 438/669; 438/672; 438/685; 438/687; 438/688; 438/622
(58) Field of Search .................. 438/3, 622, 625–629, 438/631, 642–645, 648, 652–654, 656, 669, 672, 685, 687, 688

(56) References Cited

U.S. PATENT DOCUMENTS

| | | | | |
|---|---|---|---|---|
| 5,262,354 A | * | 11/1993 | Cote et al. ................. 437/195 |
| 5,674,787 A | * | 10/1997 | Zhao et al. ................. 437/230 |
| 5,695,810 A | | 12/1997 | Dubin et al. |
| 5,747,379 A | * | 5/1998 | Huang et al. ............... 438/586 |
| 6,114,243 A | * | 9/2000 | Gupta et al. ............... 438/687 |
| 6,165,803 A | * | 12/2000 | Chen et al. ..................... 438/3 |
| 6,251,774 B1 | * | 6/2001 | Harada et al. ............. 438/637 |
| 6,251,786 B1 | * | 6/2001 | Zhou et al. ................. 438/692 |

OTHER PUBLICATIONS

Rajeev Bajaj, et al., Manufacturability Considerations and Approaches for Development of a Copper CMP Process, Sep. 7–9, 1999 VMIC Conference, 1999 IMIC.

Srini Raghavan, et al., Electrochemical Behavior of Copper and Tantalum in Silica Slurries Containing Hydroxylamine, Sep. 7–9, 1999 VMIC Conference, 1999 IMIC.

Maria Peterson, et al., Controlling Copper Loss in Damascene Structures Through Slurry Design, Sep. 7–9, 1999 VMIC Conference, 1999 IMIC.

\* cited by examiner

*Primary Examiner*—Evan Pert
*Assistant Examiner*—David A. Zarneke
(74) *Attorney, Agent, or Firm*—Slater & Matsil, L.L.P.

(57) ABSTRACT

A semiconductor device (100) having a copper damascene BEOL structure. A metal cap layer (120) is formed over conductive lines (118) to prevent oxidation of the conductive lines (118) during subsequent processing steps. The metal cap layer (120) comprises a material other than the conductive line (118) material that is resistant to oxidation. The structure (100) is particularly beneficial for MRAM devices.

20 Claims, 1 Drawing Sheet

METHOD OF MANUFACTURING A METAL CAP LAYER FOR PREVENTING DAMASCENE CONDUCTIVE LINES FROM OXIDATION

This patent claims the benefit of U.S. Provisional Patent Application Ser. No. 60/263,993 filed Jan. 24, 2001, which is incorporated herein by reference.

TECHNICAL FIELD

The present invention relates generally to semiconductor devices, and more particularly to semiconductor devices that have conductive lines formed by a damascene process in the back-end-of-line (BEOL).

BACKGROUND OF THE INVENTION

Semiconductors are used for integrated circuits for electronic applications, including radios, televisions, and personal computing devices, as examples. One type of semiconductor device is a semiconductor storage device, such as a dynamic random access memory (DRAM) and flash memory, which use an electron charge to store information.

A more recent development in memory devices involves spin electrics, which combines semiconductor technology and magnetics. The spin of an electron, rather than the charge, is used to indicate the presence of a "1" or "0". One such spin electronic device is a magnetoresistive random access memory (MRAM) device, which includes conductive lines positioned perpendicular to one another in different metal layers, the conductive lines sandwiching a magnetic stack. The place where the conductive lines intersect is referred to as a cross-point. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAM integrated circuits can be made smaller and provide a non-volatile memory. For example, a personal computer (PC) utilizing MRAMs would not have a long "boot-up" time as with conventional PCs that utilize DRAMs. MRAMs permit the ability to have a memory with more memory bits on the chip than DRAMs or flash memories. Also, an MRAM does not need to be powered up and has the capability of remembering the stored data.

A disadvantage of manufacturing MRAMs is that copper is the preferred material for conductive lines, due to the excellent conductive properties of copper compared to aluminum and other conventional metals used in semiconductor technology. A problem with using copper in the BEOL is that the copper-conductive lines must be formed using a damascene process. In a damascene process, a dielectric layer is formed, and the dielectric layer is patterned and etched to form trenches that the conductive copper lines will be formed in. When copper is used, typically a seed layer and other copper liners are used, followed by a copper fill that may be electroplated for improved fill results, for example. Copper is unable to be etched directly due to the process limitations of the copper material.

A problem in using a damascene process is that during subsequent processing steps, for example during subsequent dielectric and inter-metallic layer formation and deposition, a photoresist is often used, which must be stripped. A photoresist strip process typically involves using an oxygen plasma etch process to remove the resist. Copper oxidizes very easily, which is disadvantageous in certain semiconductor devices where the copper conductive line must have good electrical contact to subsequently deposited layers. For example, in an MRAM device, it is important for a first metallization layer conductive copper line to be electrically coupled to a magnetic stack deposited thereon.

What is needed in the art is a semiconductor device and method of fabrication thereof that prevents oxidation of copper conductive lines during processing steps involving oxygen, such as a photoresist strip.

SUMMARY OF THE INVENTION

The present invention achieves technical advantages as a device and method for fabricating conductive lines in the BEOL that prevents oxidation of the conductive lines during photoresist strip and other subsequent fabrication processes.

Disclosed is a wiring structure for semiconductor devices, comprising an inter-level dielectric (ILD) having a top surface disposed over a workpiece, conductive lines formed within the ILD, the conductive lines being recessed below the ILD top surface, and a metal cap layer disposed over the conductive lines, the metal cap layer being resistive to oxidation.

Also disclosed is an MRAM device, comprising a first ILD having a top surface disposed over a workpiece, first conductive lines formed within the first ILD, where the first conductive lines are recessed below the first ILD top surface. A first metal cap layer is disposed over the first conductive lines, the first metal cap layer being resistive to oxidation and filling the first conductive line recess. A magnetic stack is disposed over the first metal cap layer.

Further disclosed is a method of forming conductive lines in a semiconductor device, comprising depositing a first ILD having a top surface over a workpiece, patterning and etching the first ILD to form trenches, filling the trenches with a conductive material, removing portions of the conductive material from the first ILD top surface and from beneath the ILD top surface to form recesses in the conductive material below the ILD top surface, and depositing a first metal cap layer over the conductive material and the first ILD within the recess, the first metal cap layer being resistant to oxidation. The excessive metal cap layer is removed leaving only those on top of metal lines.

Also disclosed is a method of fabricating an MRAM, comprising depositing a first ILD having a top surface over a workpiece, patterning and etching the first ILD to form trenches, filling the trenches with a conductive material, removing portions of the conductive material from the first ILD top surface and from beneath the ILD top surface, wherein the conductive material is recessed below the ILD top surface, and depositing a first metal cap layer over the conductive material and the first ILD within the recess, where the first metal cap layer is resistant to oxidation. A CMP process is performed to remove the first metal cap layer everywhere but from on top of the metal. A magnetic stack is formed over the first metal cap layer, and following a magnetic stack patterning process, a second ILD having a top surface is deposited over the magnetic stack. The second ILD is patterned and etched to form trenches, the trenches are filled with a conductive material, and portions of the conductive material are removed from the second ILD top surface and from beneath the ILD top surface, wherein the conductive material is recessed below the second ILD top surface. A second metal cap layer is deposited over the conductive material and the second ILD within the recess, the second metal cap layer being resistant to oxidation.

Advantages of the invention include providing a structure and method of fabrication of conductive lines in the BEOL that prevent oxidation of conductive lines and enable electrical contact to subsequently deposited layers in the device. The conductive lines surface smoothness requirements may be relaxed in accordance with the present invention. A metal cap is used to prevent the conductive lines from oxidation during subsequent processing steps such as plasma photoresist stripping and dielectric materials deposition, eliminating or reducing the need for the use of hard masks, which is generally required to RIE a material that is directly on top of Cu, to prevent the resist stripping process while exposing Cu. Because the use of hard masks is eliminated or reduced, the number of processing steps is reduced, resulting in reduced costs and increased throughput. The metal cap may be used for multi-level lithography that has conductive lines exposed during photoresist stripping, such as in MRAM cross-point cell manufacturing, for example.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Figure 1:
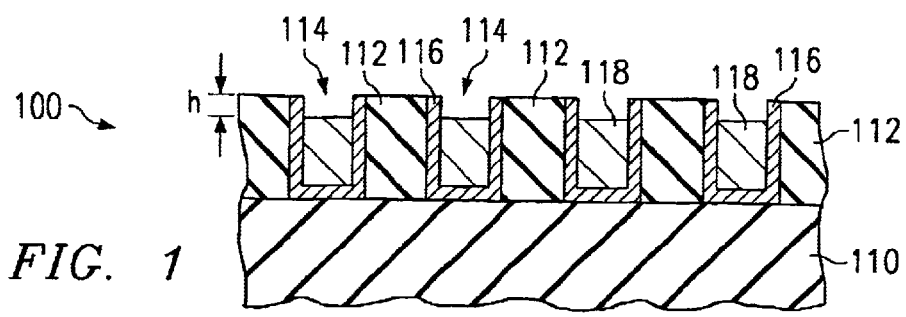
FIGS. 1 through 3 illustrate cross-sectional views of a semiconductor device having a metal cap formed over copper conductive lines in accordance with the present invention in various stages of fabrication.

A problem in prior art copper damascene BEOL structures is discussed, followed by a description of preferred embodiments of the present invention and advantages thereof.

In copper damascene BEOL prior art structures, to form copper wiring patterns, copper is deposited over patterns or trenches in an inter-level-dielectric (ILD) and then chemically-mechanically polished (CMP). A dielectric cap layer comprised of silicon nitride, for example, is usually deposited over the copper to protect the exposed copper surface, because copper is easily oxidized. This silicon nitride cap layer is etched using a hard mask during the next level via RIE process to protect the copper from exposing to the resist striping process.

However, in some applications such as in the manufacturing of MRAM devices, lithographic patterns need to be built on top of the CMP finished surface at several levels. The photoresist stripping may cause the oxidation of the exposed copper wiring.

In a specific type of MRAM device, commonly called a "cross-point cell", a magnetic stack is built over and electrically coupled to the top of the copper conductive lines. A dielectric layer such as silicon nitride cannot be used, because the magnetic stack must be in contact with the conductive lines above and below it for the MRAM cell to function properly.

Several lithography masks and etches are needed to create the magnetic stack, for example, a mask and etch to create and/or open the alignment marks on the CMP finished surface for the next non-transparent level to align to. Another example is a mask and etch to form the pattern of the magnetic devices. A further example is a mask and etch to remove the later-deposited dielectric layers that are not located in the MRAM device area.

A common prior art practice for these mask and etch steps is to use a hard mask that is deposited on the surface prior to the lithography process and to transfer the pattern to the hard mask using a photoresist. The photoresist is stripped, and the pattern is transferred from the hard mask to the desired underlying level. Finally, the hard mask is stripped off. This hard mask approach increases the manufacturing process complexity and also increases the cost.

The present invention provides an alternative approach that simplifies the processing steps for a copper damascene BEOL semiconductor device. A copper CMP usually comprises two steps: a first CMP step that removes copper at a high rate, e.g., at a rate of 600 to 800 nanometers per minute, and a second CMP step to remove the copper at a slower rate with a desired selectivity to the liner and ILD by adjusting the chemistry of the CMP slurry. It is particularly difficult to control copper from eroding and dishing, for example, which may result in the height of the copper surface being lower than the liner and the ILD top surfaces. The copper erosion and dishing of the copper conductive line beneath the top surface of the ILD can easily reach around 80 nanometers or even more.

The present invention takes advantage of these CMP phenomena, which naturally occurs due to the nature of the CMP second step that is performed at a lower rate. A preferred embodiment of the present invention at various stages of fabrication is shown in cross-sectional views in FIGS. 1 through 3. Shown generally at 100 is a semiconductor wafer comprising a workpiece 110. The workpiece 110 typically comprises silicon oxide over single crystal silicon. The workpiece 110 may include other conductive layers or other semiconductor elements, e.g., transistors, diodes, etc. Compound semiconductors such as GaAs, InP, Si/Ge, SiC, for example, may be used in place of silicon.

A dielectric layer 112 is deposited over the workpiece 110, as shown in FIG. 1. Dielectric layer 112 may comprise an ILD layer, for example, and typically comprises silicon dioxide or other insulating materials.

Using a damascene process, dielectric layer 112 is patterned and etched to form trenches 114 in which conductive lines will later be formed. A liner 116 may be deposited over dielectric layer 112. Liner 116 may comprise, as an example, a layer of TaN and a layer of Ta deposited by physical vapor deposition (PVD), for example, in a thickness of 150 Angstroms and 200 Angstroms, respectively, for example. Alternatively, other materials such as TiN and W, may be deposited, for example, by chemical vapor deposition (CVD) in thicknesses of around 50 to 100 Angstroms, and 50 to 150 Angstroms, respectively, may also be used, as examples. Typically, a combination of different chemistries are used for the liner 116, i.e., a multi-layer liner rather than a single layer liner is usually used.

Next, a layer of conductive material, preferably comprising copper, is deposited over the liner 116 to fill the trenches 114. After being deposited or electroplated, the conductive layer typically resides over the entire surface of the dielectric layer 112.

A CMP process is performed on the wafer 100 to remove the conductive material and the liner 116 from the top of the dielectric layer 112 surface. In accordance with the present invention, during the CMP process, the conductive layer is removed not only from the top surface of the dielectric layer 112, but also is removed below the top surface of dielectric layer 112 by a recessed amount "h". Preferably the height "h" of the recess is 10 to 100 nanometers lower than the top of the dielectric surface 112, and more preferably, is 25 to 60 nanometers lower than the top surface of dielectric layer 112, as shown in FIG. 1. The structure shown in FIG. 1 illustrates conductive lines 118 being recessed by an amount "h" below the top surface of dielectric layer 112.

Preferably, rather than using a two-step CMP process as in the prior art, using a coarse polish followed by a fine polish, as previously described, a single coarse polish process is used to remove the conductive material from the top surface of the dielectric material 112 and form a recess having height "h" over conductive line 118. Advantageously, in accordance with the present invention, a fine polish to smooth the conductive line 118 surface is not required, because the final surface finish (of metal cap layer 120, to be described further herein) will be performed in a subsequent step.

Preferably, the liner 116 height is greater than the height of the copper conductive lines 118, although the liner 116 may also be recessed below the top of the dielectric layer 112 by amount "h" or an amount less than "h", for example.

Figure 2:
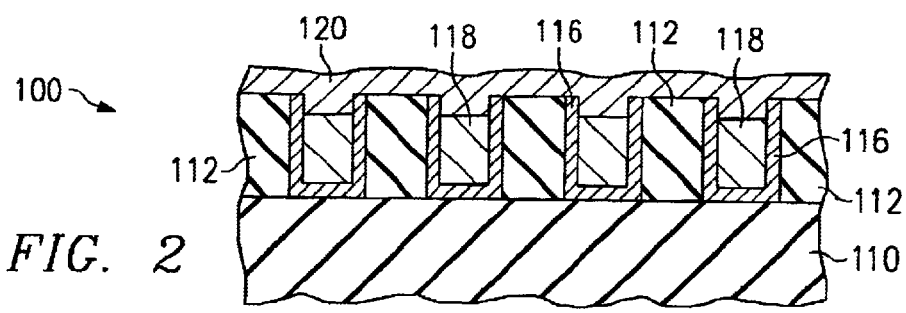

Next, a metal cap layer 120 is deposited over dielectric layer 112 and conductive lines 118, as shown in FIG. 2 to fill the recess. The metal cap layer 120 preferably comprises a conductive material other than the conductive line 118 material, e.g., a material other than copper. Preferably, metal cap layer 120 comprises a material that is resistant to oxidation. For example, metal cap layer 120 may comprise W, Ti, TiN, Ta, TaN, TiW, Al, CoWP, CoP, combinations thereof, or one or more layers of combinations thereof. Metal cap layer 120 may be deposited by PVD, CVD, or may be electroless-plated and selectively deposited on top of copper conductive lines 118 only. The thickness of the metal cap layer 120 deposited preferably ranges from 10 to 150 nanometers, and more preferably ranges from 25 to 100 nanometers.

Figure 3:
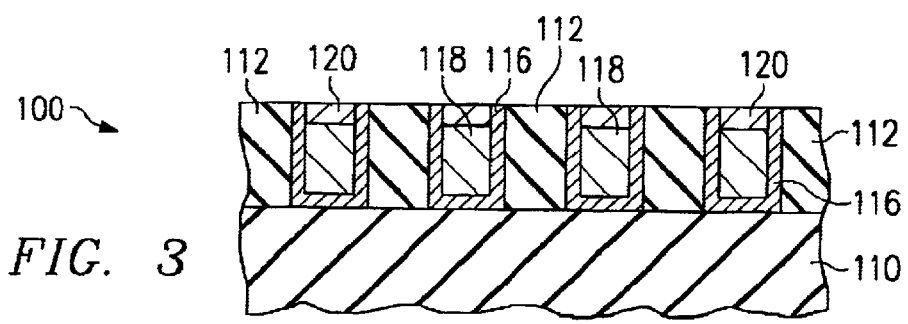

Metal cap layer 120 is CMP'd to remove portions of the metal cap layer 120 from the top of the dielectric layer 112, as shown in FIG. 3. After the CMP process, a portion of the metal cap layer 120 remains on top of the copper lines 118 within the recess having a height "h", previously described herein. Preferably in semiconductor device applications such as MRAM cross-point cell manufacturing, the CMP process is a fine polish, to leave a polished surface on the top surface of metal cap layer 120.

A metal cap layer 120 may be formed over each metallization layer of a semiconductor device. The metal cap layer 120 serves as an oxidation barrier for metallization layers, and eliminates or reduces the need for multi-level hard masks that are typically used to protect copper conductive layers from oxidation in semiconductor device manufacturing. Further lithography processing steps may be subsequently performed using traditional photoresists and oxygen plasma etches, due to the novel use of the metal cap layer 120 described herein.

Figure 4:
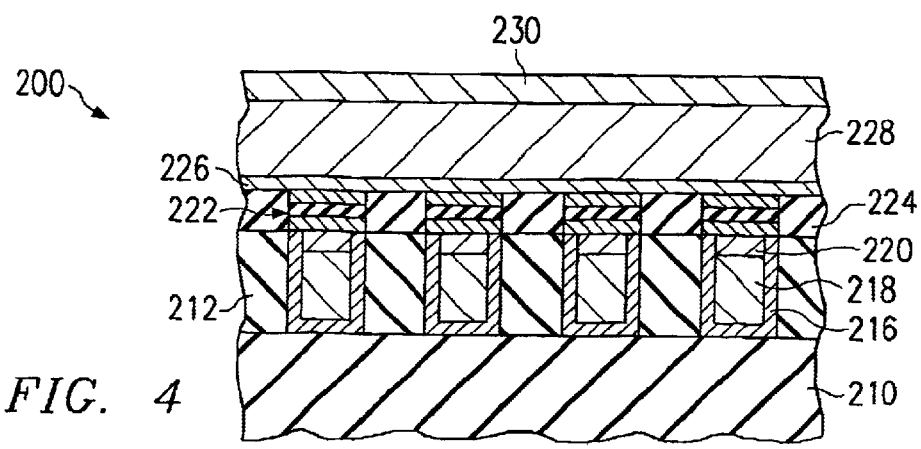
FIG. 4 illustrates generally at 200 an MRAM device with a metal cap layer over conductive lines in accordance with the present invention.

FIG. 4 illustrates the metal cap layer of the present invention used in an MRAM device. A first ILD layer 212 is deposited over a workpiece 210. First ILD layer 114 may comprise silicon oxide, and may also comprise a low dielectric constant material or other dielectric materials, for example. Examples of other suitable dielectrics include Silk™, fluorinated silicon glass, and FOX™, for example. First ILD layer 212 is patterned and etched to form trenches for first conductive lines 218.

A liner 216 preferably comprising a multi-layer liner as described previously herein may be deposited over dielectric layer 212. A layer of first conductive material, which may comprise a first or second metallization layer comprising copper, for example, is deposited over the liner 216 to fill the trenches. The first conductive layer, after being deposited or electroplated, for example, resides over the entire first ILD layer 212.

A CMP process is performed on the wafer to remove the first conductive material and the liner 216 from the top of the first ILD layer 212. The first conductive layer is removed not only from the top of the first ILD layer 212, but also is removed below the top surface of first ILD layer 212 by a recessed amount. Preferably, the height of the recessed is 10 to 100 nanometers lower than the top of the first ILD layer 212, and more preferably 25 to 60 nanometers lower than the top surface of first ILD layer 212.

A first metal cap layer 220 is deposited over the first ILD layer 212 and first conductive lines 218. The first metal cap layer 220 preferably comprises a conductive material other than the first conductive line 218 material, e.g., a material other than copper. Preferably, first metal cap layer 220 comprises a material that is resistant to oxidation. For example, first metal cap layer 220 may comprise W, Ti, TiN, Ta, TaN, TiW, Al, CoWP, CoP, combinations thereof, or one or more layers of combinations thereof. First metal cap layer 220 may be deposited by PVD, CVD, or may be electroless-plated and selectively deposited on top of first conductive lines 218 only. The thickness of the first metal cap layer 120 deposited preferably ranges from 10 to 150 nanometers, and more preferably ranges from 25 to 100 nanometers.

First metal cap layer 220 is CMP'd to remove portions of the first metal cap layer 220 from the top of the first ILD layer 212. After the CMP process, a portion of the first metal cap layer 220 remains on top of the first conductive lines 218 within the recess. Preferably, the amount of first metal cap layer 220 remaining in the recess ranges in thickness over the first conductive lines from 10 to 100 nanometers, and more preferably ranges from 25 to 60 nanometers.

Next, a magnetic stack 222 is formed over first conductive lines 218 and first metal cap layer 220. Magnetic stack 222 may include a bottom metal stack, a thin dielectric layer, and a top metal stack, for example. First, a bottom metal stack (not shown) is deposited over first metal cap layer 220 and top portions of first liner 216. The bottom metal stack preferably comprises a plurality of metal layers, comprising PtMn, CoFe, Ru, and NiFe, for example, although other types of suitable magnetic materials and metal layers may be used. Four to eight layers are typically used for the bottom metal stack. Various techniques such as physical vapor deposition (PVD), evaporation, ion sputtering, and chemical vapor deposition (CVD) may be used to deposit the magnetic layers of bottom metal stack. Because each layer is very thin, e.g. most of them <100 Angstroms, preferably, the layers are deposited by PVD. Preferably, the bottom metal layer is between 200 and 400 Angstroms thick.

The magnetic stack 222 also comprises a thin dielectric layer (not shown) deposited over the bottom metal stack.

The thin dielectric layer preferably may comprise, for example, aluminum oxide ($Al_2O_3$), and is preferably 10–15 Angstroms thick.

The magnetic stack 222 also comprises a top metal layer (not shown) deposited over the thin dielectric layer. The top metal layer comprises a plurality of magnetic layers, for example, and may comprise similar materials deposited using similar processes as are used to form bottom metal layer. The total thickness of magnetic stack 222 may be, for example, 500 Angstroms. The magnetic stack 222 is patterned and etched to leave substantially square portions of magnetic stack 22 in cross-point regions where the orthogonal conductive lines 218 and 228 intersect.

A second ILD layer 224 is deposited. The second ILD layer is patterned and etched to form trenches where second conductive lines will be formed. The trenches are filled with a second conductive material 228, e.g. copper. A liner 226 may be deposited prior to filling the trenches with second conductive material 228. Portions of the second conductive material 228 are removed from the second ILD layer 224 top surface and from beneath the second ILD layer 224 top surface, e.g. using a CMP process, wherein the second conductive material is recessed below the second ILD layer 224 top surface.

A second metal cap layer 230 is deposited over the second conductive material 228 within the recess and over the second ILD layer 224. The second metal cap layer 230 comprises a material that is resistant to oxidation, and also preferably comprises a non-copper material. The thickness of the second metal cap layer 120 deposited preferably ranges from 10 to 150 nanometers, and more preferably ranges from 25 to 100 nanometers. Second metal cap layer 220 is CMP'd to remove portions of the second metal cap layer 220 from the top of the second ILD layer 212. After the CMP process, a portion of the second metal cap layer 220 remains on top of the second conductive lines 218 within the recess. Preferably, the amount of second metal cap layer 220 remaining in the recess ranges in thickness over the second conductive lines from 10 to 100 nanometers, and more preferably ranges from 25 to 60 nanometers.

Because second conductive line 228 is orthogonal or perpendicular with respect to underlying first conductive lines 218, a side view of a second conductive line 228 is visible in FIG. 4, whereas a plurality of first conductive lines 218 is visible. First conductive lines 218 preferably run in a first direction and serve as bitlines or wordlines of the MRAM memory array. Second conductive lines 228 preferably run in a second direction orthogonal to the first direction, and serve as bitlines or wordlines of the MRAM memory array.

A third ILD layer may be deposited over second conductive lines 228 and second metal cap layer 230, not shown. Subsequent processing steps may then be performed on the wafer 200 to complete the fabrication of the MRAM.

Although the metal cap layer 120/220/230 described herein is especially beneficial in MRAM cell manufacturing, the metal cap layer 120/220/230 is beneficial in other semiconductor devices having copper damascene BEOL structures. While the metal cap layer 120/220/230 is described herein primarily for use with copper conductive lines, the use of a metal cap layer 120/220/230 in accordance with the present invention is also beneficial for protecting conductive lines comprised of other conductive materials that are prone to oxidization.

An advantage of the invention includes relaxing the smoothness requirement of the top surface of conductive leads 118/218/228, which can be difficult to accomplish with current CMP processes. The metal cap layer 120/220/230 is formed only on top of the conductive leads 118/218/228, which is advantageous because the metal cap layer 120/220/230 prevents the conductive lines 118/228 from oxidizing during plasma photoresist stripping on exposed conductive surfaces in subsequent processing steps. Another advantage is that the metal cap layer 120/220/230 protects the conductive line 118/218/228 surface during subsequent multi-level lithography steps of the semiconductor wafer 100/200, eliminating or reducing the need to use hard masks. Because the use of hard masks is eliminated or reduced, the number of processing steps is reduced, resulting in reduced costs and increased throughput. Another advantage of using the metal cap layer is that the cap layer helps to suppress underlying Cu lines from extrusion during subsequent high temperature processes. The extrusion is especially detrimental to the MRAM devices siting on top of Cu, since the magnetic polarity is difficulty to turn in non-flat magnetic layers.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a magnetic random access memory (MRAM), the method comprising:

forming a first inter-level dielectric (ILD) having a top surface over a workpiece;

patterning and etching the first ILD to form a first trench;

conformally depositing a first conductive liner on the first ILD top surface and in the first trench;

depositing a first conductive material over the first liner to fill the first trench;

removing the first liner and the first conductive material from the first ILD top surface, and removing a portion of the first conductive material from the first trench, wherein the first conductive material is recessed below the first ILD top surface;

depositing a first metal cap layer over the first ILD top surface and over the first conductive material in the first trench;

removing the first metal cap layer front the first ILD top surface; and forming a magnetic stack directly over the first trench and electrically contacting the first metal cap layer, the magnetic stack having a bottom metal layer, a middle layer, and a top metal layer, wherein the bottom metal layer, the middle layer and the top metal layer are directly over the first trench.

2. The method of claim 1 further comprising:

depositing a second ILD having a top surface over the magnetic stack and the first ILD;

patterning and etching the second ILD to form a second trench;

conformally depositing a second conductive liner on the second ILD top surface and in the second tench;

depositing a second conductive material over the second liner to fill the second trench;

removing the second liner and the second conductive material from the second ILD top surface, and removing a portion of the second conductive material from the second trench, wherein the second conductive material is recessed below the second ILD top surface; and depositing a second metal cap layer over the second conductive material in the second trench.

3. The method of claim 1, wherein the removing of the first liner and the first conductive material are performed in a single process step.

4. The method of claim 2, wherein the first and second trenches are formed approximately perpendicular to each other.

5. The method of claim 1, wherein the removing the portion of the first conductive material comprises recessing the first conductive material below the first ILD top surface by about 10 to 100 nanometers.

6. The method of claim 1, wherein the depositing of the first conductive material comprises depositing copper.

7. The method of claim 1, wherein the depositing of the first metal cap layer comprises depositing a material selected from the group consisting of: W, Ti, TiN, Ta, TaN, TiW, Al, CoWP, CoP, combinations thereof, and one or more layers of combinations thereof.

8. The method of claim 1, wherein the removing of the first liner and the first conductive material comprises a single chemical-mechanical polishing (CMP) processing step.

9. The method of claim 1, wherein the first liner comprises a material selected from the group consisting of Ta, TaN, TiN, W, and combinations thereof.

10. The method of claim 1, wherein the forming of the magnetic stack comprising:

forming the bottom metal layer having a magnetic layer;

forming the middle layer having a thin dielectric layer on the bottom metal layer; and forming the top layer having a magnetic layer on the middle layer.

11. A method of fabricating a magnetic random access memoty (MRAM), the method comprising:

forming a first inter-level dielectric (ILD) having a top surface over a workpiece;

patterning and etching the first ILD to form a first trench;

conformally depositing a first conductive liner on the first ILD top surface and in the first trench;

depositing a first copper layer over the first liner to fill the first trench;

etching the first copper layer and the first liner, wherein the first copper layer and the first liner are removed from the first ILD top surface, and wherein the first copper layer is recessed below the first ILD top surface;

depositing a first metal cap layer over the first ILD top surface and over the first copper layer in the first trench;

removing the first metal cap layer from the first ILD top surface; and forming a magnetic stack directly over the first trench and electrically contacting the first metal cap layer, the magnetic stack having a bottom metal layer, a middle layer, and a top metal layer, wherein the bottom metal layer, the middle layer and the top metal layer are directly over the first trench.

12. The method of claim 11, further comprising:

depositing a second ILD having a top surface over the magnetic stack and the first ILD;

patterning and etching the second ILD to form a second trench;

conformally depositing a second conductive liner on the second ILD top surface and in the second trench;

depositing a second copper layer over the second liner to fill the second trench;

etching the second copper layer and the second liner, wherein the second copper layer and the second liner are removed from the second ILD top surface, and wherein the second copper layer is recessed below the ILD top surface; and depositing a second metal layer over the second copper layer in the second trench.

13. The method of claim 11, wherein the removing of the first liner and the first copper layer are performed in a single process step.

14. The method of claim 12, wherein the first and second trenches are formed approximately perpendicular to each other.

15. The method of claim 11, wherein the etching of the first copper layer comprises recessing the first layer below the first ILD top surface by about 10 to 100 nanometers.

16. The method of claim 12, wherein the etching of the second copper layer comprises recessing the second copper layer below the second ILD top surface by about 10 to 100 nanometers.

17. The method of claim 12, wherein the depositing of the first metal cap layer and the depositing of the second metal cap layer each comprise depositing a material selected from the group consisting of: W, Ti, TiN, Ta, TaN, TiW, Al, CoWP, CoP, combinations thereof, and one or more layers of combinations thereof.

18. The method of claim 12, wherein the first and second liners comprise a material selected from the group consisting of: Ta, TaN, TiN, W, and combinations thereof.

19. The method of claim 11, wherein the forming of the magnetic stack comprises:

forming the bottom metal layer having a magnetic layer;

forming the middle layer having a thin dielectric layer on the bottom metal layer; and forming the top layer having a magnetic layer on the middle layer.

20. A method of fabricating a magnetic random access memory (MRAM), the method comprising:

forming a first inter-level dielectric (ILD) having a top surface over a workpiece;

patterning and etching the first ILD to form a first trench;

conformally depositing a first conductive liner on the first ILD top surface and in the first trench;

depositing a first copper layer over the first liner to fill the first trench;

removing the first liner and the first copper layer from the first ILD top surface, and removing a portion of the first copper layer from the first trench, wherein the first copper layer is recessed below the first ILD top surface;

depositing a first metal cap layer over the first copper layer in the first trench;

forming a magnetic stack directly over the first trench and electrically contacting the first metal cap layer;

depositing a second ILD having a top surface over the magnetic stack and the first ILD;

patterning and etching the second ILD to form a second trench;

conformally depositing a second conductive liner on the second ILD top surface and in the second trench;

depositing a second copper layer over the second liner to fill the second trench;

removing the second liner and the second copper layer from the second ILD top surface, and removing a portion of the second copper layer from the second trench, wherein the second copper layer is recessed below the second ILD top surface; and depositing a second metal cap layer over the second copper layer in the second trench, the magnetic stack having a bottom metal layer, a middle layer, and a top metal layer, wherein the bottom metal layer, the middle layer and the top metal layer are directly over the first trench.

* * * * *

UNITED STATES PATENT AND TRADEMARK OFFICE
CERTIFICATE OF CORRECTION

PATENT NO. : 6,709,874 B2
DATED : March 23, 2004
INVENTOR(S) : Ning

It is certified that error appears in the above-identified patent and that said Letters Patent is hereby corrected as shown below:

Column 8,
Line 56, delete "front" and substitute -- from --.

Column 9,
Line 22, delete "the removing the" and insert -- the removing of the --.

Signed and Sealed this

Twenty-seventh Day of July, 2004

JON W. DUDAS
*Acting Director of the United States Patent and Trademark Office*